INVENTOR.
JESSE MORE GREENMAN, 3rd
BY Joseph L. Spiegel
ATTORNEY

United States Patent Office 3,453,781

Patented July 8, 1969

3,453,781

TAILORING MICROMINIATURE COMPONENTS

Jesse M. Greenman III, La Grangeville, N.Y., assignor to International Business Machines Corporation, Armonk, N.Y., a corporation of New York Filed Mar. 30, 1966, Ser. No. 538,679
Int. Cl. B24c *3/00;* B24b *49/00, 51/00*
U.S. Cl. 51—8 2 Claims

ABSTRACT OF THE DISCLOSURE

Microminiature functional components including active and tailorable passive circuit elements are adjusted to a predetermined DC operating point by placing each component in an operating environment, monitoring its output on external precise components, and altering the characteristics of the passive circuit elements until the component reaches a predetermined DC operating point.

This invention relates to a method of and apparatus for tailoring microminiature functional components, and in particular to tailoring completely assembled microminiature components to a predetermined DC operating point.

Many information handling systems are based upon a plurality of "building block" circuits which are conveniently interconnected to perform any desired logic function, for example, arithmetic, data storage and the like. One approach to the fabrication of such building blocks is to microminiaturize individual active and passive elements and fasten them to a miniaturized substrate. This approach is generally referred to as hydrid circuitry, and is described in more detail in a copending application of Edward M. Davis, Jr., et al., entitled "Functional Components," Ser. No. 300,734, filed Aug. 8, 1963, and assisted to the same assignee as the persent invention.

Briefly the method for fabricating such building blocks comprises the steps of preparing a substrate for graphic arts processing printing on the surface of the substrate a unique metallic topology, firing the substrate at a preselected temperature to establish a land pattern thereon, applying passive elements such as resistors, capacitors and inductors to the substrate at discrete locations in the land pattern, coating the pattern with solder to insure good electrical continuity, tailoring or trimming the passive elements to bring the elements to a desired value and subsequently securing active elements such as semiconductor chips to the pattern, whereby a microminiature functional component is produced.

Prior to tailoring, the passive elements have tolerance limits as great as ±25%. So that the functional component will meet desired specification, it has been the practice in the prior art that *prior* to active element placement the passive elements are each separately trimmed to very close tolerances. For example, the area of a screened layer of resistor material is made to be larger than required and the resistive value is adjusted by physically removing a portion of the material by abrasion. Apparatus for trimming resistors in accordance with this technique is described in more detail in IBM Technical Disclosure Bulletin No. 9, pp. 15–16 (February 1962). Alternatively, trimming can be accomplished by burning, grinding and pulse discharge.

It is well known that among the functional components frequently employed in information handling systems are semi-conductor amplifiers of various form, e.g. common emitter, common base and common collector. These amplifiers are described in any well known text as, for example, Transistor Electronics, by David De Witt and Arthur L. Rossoff, published by McGraw-Hill Book Company, Inc., 1957. The output characteristics of these amplifier configurations are normally defined by a family of static curves. Thus, in the case of the common emitter and common base configurations, collector current vs. collector voltage is plotted for various base currents. Similarly, the characteristics of the common collector amplifier are described by a family of collector current vs. base voltage curves for various collector voltages. The DC operating point for each type amplifier may be designated by any two or three parameters. Thus, in the case of the common emitter configuration, for example, the collector voltage and base current alone will define the amplifier's DC operating point.

It is desired in information handling systems that amplifiers employed in corresponding systems have corresponding DC operating points. This provides unity of performance. Notwithstanding the extreme care exercised in fabricating functional components and the tailoring of each of the separate passive elements to close tolerances, according to the prior art method briefly described above, it is still found that a significant percentage of the completed components fail to meet specifications by falling outside the tolerance limits specified and necessary. This is due in part to the fact that the inherent error (the amount by which an element trimmed is off exact specification) introduced at each trimming operation can be cumulative but principally because of the differences in characteristics of the subsequently secured active elements. Thus, where the functional component is an amplifier circuit, similar operating points may not be obtained even though the same parameters define the operating points.

Accordingly, the principal object of the present invention is an improved method and apparatus for tailoring microminiature functional components.

Another object is adjusting the operating point of one transistor amplifier circuit to correspond with that of another.

Still another object is tailoring microminiature components including active and passive elements to a precise, predetermined DC operating point without the necessity of tailoring all elements to close tolerances.

A further object is a tailoring method and apparatus which is readily suitable for mass production techniques.

These and other objects are accomplished in accordance with the present invention, one illustrative embodiment of which comprises placing each microminiature amplifier in an operating environment, monitoring the output of each amplifier on external precision components, and altering the characteristics of passive elements associated with the amplifier until the amplifier reaches a predetermined DC operating point.

One feature of the present invention is apparatus for tailoring a microminiature functional component to a predetermined DC operating point, the component including active and passive elements defining an electrically continuous circuit, at least one of the elements being a tailorable device whose impedance is capable of being altered to vary the output current of the component comprising: means for energizing the component; a standard impedance element for monitoring the output current of the component; means for measuring the potential drop across the standard impedance element; means for altering the impedance of the tailorable device; and means controlled by the measuring means to discontinue operation of the impedance altering means when the potential drop across the standard impedance element reaches a predetermined value.

Another feature is apparatus of the above type wherein the measuring means includes a reference voltage in parallel with the standard impedance element, the controlled means being energized when the potential drop across the standard impedance element is different from the value of the reference voltage.

Still another feature is apparatus of the above type wherein the tailorable device is capable of being subjected to the change in physical dimensions to alter its impedance and wherein the impedance altering means includes means for subjecting the device to a change in physical dimensions, such as a sandblasting device.

A still further feature is apparatus of the above type including a thermal compensating means connected between the measuring means and the control means.

Another feature is a method for tailoring a microminiature functional component to a predetermined DC operating point, the component including active and passive elements defining an electrically continuous circuit, at least one of the elements being a tailorable device whose impedance is capable of being altered to vary the output current of the component comprising: altering the impedance of the tailorable device; continuously monitoring the DC output of the component; and terminating the impedance altering when the component reaches a predetermined DC operating point.

The foregoing and other objects, features and advantages of the invention will be apparent from the following more particular description of the preferred embodiments of the invention as illustrated in the accompanying drawings.

As mentioned above, the output characteristics of transistor amplifier circuits are normally defined by a family of static curves. By way of illustration, FIGURE 1 discloses a typical transistor amplifier circuit in the common emitter configuration including an NPN transistor, forward biasing source $V_e$ and reverse biasing source $V_c$. The output characteristics of this circuit, graphically illustrated in FIGURE 2, are a family of collector current vs. collector voltage curves for various base currents $I_{b1}$, $I_{b2}$, etc. Various base currents are obtained by adjusting $R_t$.

The DC operating point for this circuit can be designated by any two of three parameters. For example, for a given collector voltage $V_{c1}$, and base current $I_{b2}$, the DC operating point A is designated at which collector current will be $I_{c1}$.

It is desired, for the sake of uniformity in performance, that amplifiers employed in corresponding systems have corresponding DC operating points. Where amplifier circuits are uniformly mass produced, similar operating points may not be obtained even though the same two parameters are used to define the operating point. For example, for a given collector voltage $V_{c1}$ and base current $I_{b2}$, one amplifier circuit having the FIGURE 1 configuration will have the DC operating point A, while another fabricated in a similar manner will have an operating point A′ and collector current $I_{c2}$. This is due in part to errors introduced by passive elements associated with the circuit, but principally because of the difference in characteristics of the transistors.

It is desired, therefore, to adjust the curves of each individual transistor amplifier circuit to correspond with those of all others. This may be accomplished by altering the characteristics of passive elements associated with the transistors after securing the active elements and placing the completed circuit in an operating environment. Thus, in the case of two common emitter amplifiers having different output characteristics, correction may be achieved by adjusting the resistor $R_t$ for one of them relative to the other. This invention, therefore, is directed to trimming components of amplifiers in an operating environment to obtain the same operating points for corresponding circuits.

Figure 1:
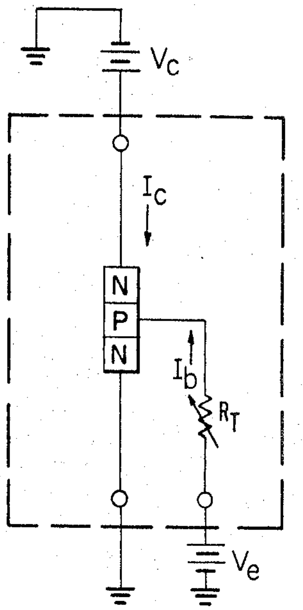
FIGURE 1 is an electrical schematic of a common emitter amplifier circuit.
Figure 2:
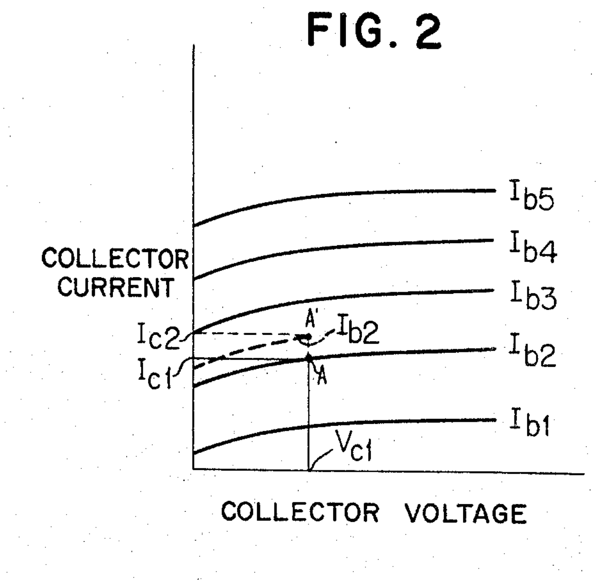
FIGURE 2 is a plot of a typical family of output characteristic curves for a common emitter amplifier circuit.
Figure 3:
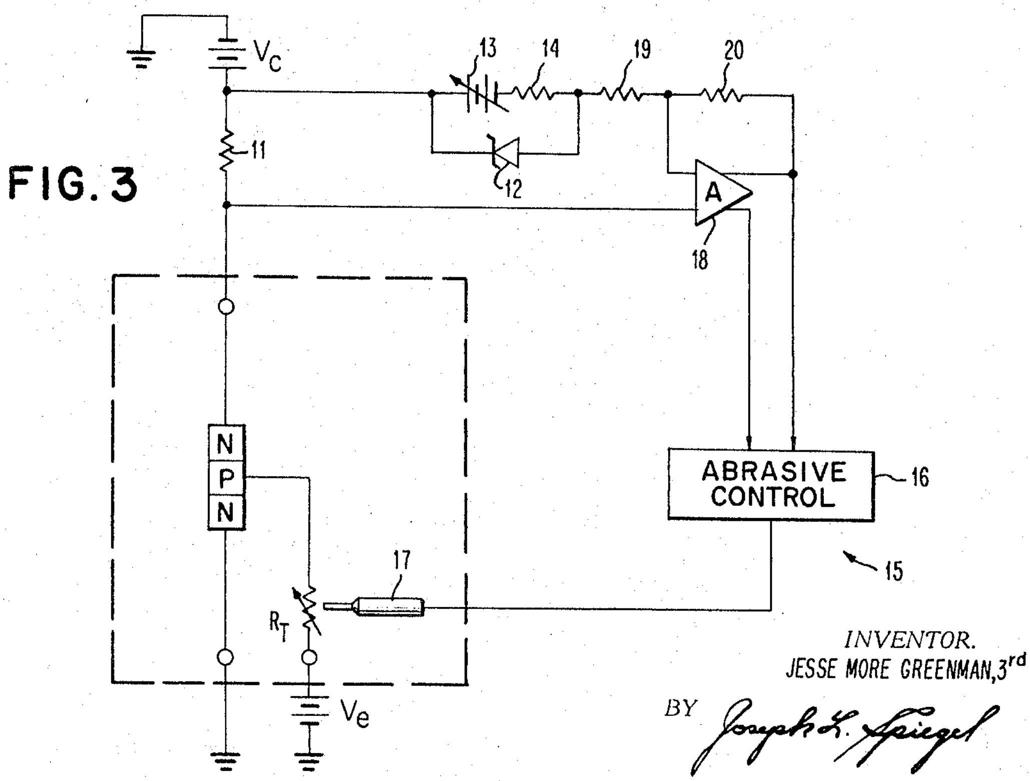
FIGURE 3 is a schematic of the circuit of FIGURE 1 illustrated in connection with the novel tailoring apparatus of the present invention.

FIGURE 3 is a schematic of the amplifier circuit of FIGURE 1 illustrated in connection with the novel apparatus of the present invention for tailoring the circuit to a predetermined DC operating point. The apparatus includes means for energizing the circuit; a standard impedance element for monitoring the output current; means for measuring the potential drop across the standard impedance element; means for altering the impedance of $R_t$; and monitoring means controlled by the measuring means to discontinue operation of the impedance altering means when the potential drop across the standard element reaches a predetermined value.

The means for energizing the circuit include the sources $V_e$ and $V_c$. The values of $V_c$ and $V_e$ are chosen such that they correspond to the values to be encountered in the circuits actual operating environment.

A precision resistor 11 is inserted in the collector current path, external to the amplifier circuit itself.

In the measuring circuit, the potential drop across the resistor 11 is compared to a reference voltage, in this case the voltage drop produced across the Zener diode 12 by the source 13 serially connected to the diode 12 and resistor 14.

The impedance altering means 15 is an abrasive trimmer of the type sold by the S. S. White Company and known as the "Airbrasive" miniature sandblaster. The initial value of the resistor $R_t$ is less than required. Upon actuation of the abrasive control 16, abrasive material is directed through the nozzle 17 to the resistor $R_t$ being trimmed. A path or notch is cut into the resistor which raises the resistor value to its desired level.

The output of the measuring circuit depends on the difference in potential drop across Zener diode 12 and precision resistor 11, and will become less and less as resistor $R_t$ is trimmed until balance is achieved. The output is fed to the monitoring circuit. The monitoring circuit includes the operational amplifier 18, source 19 and feedback 20 resistors. The monitoring circuit amplifies the signal from the measuring circuit to actuate the abrasive control 16. When balance is achieved in the measuring circuit, this halts any further abrasive action. The amplifier circuit is now tailored to a predetermined DC operating point, the distinct advantage being the reproducibility of circuit operating points by monitoring on a precision external component. Thus, all like circuits can be set to the same DC operating point at a rapid rate with a high degree of accuracy.

Figure 4:
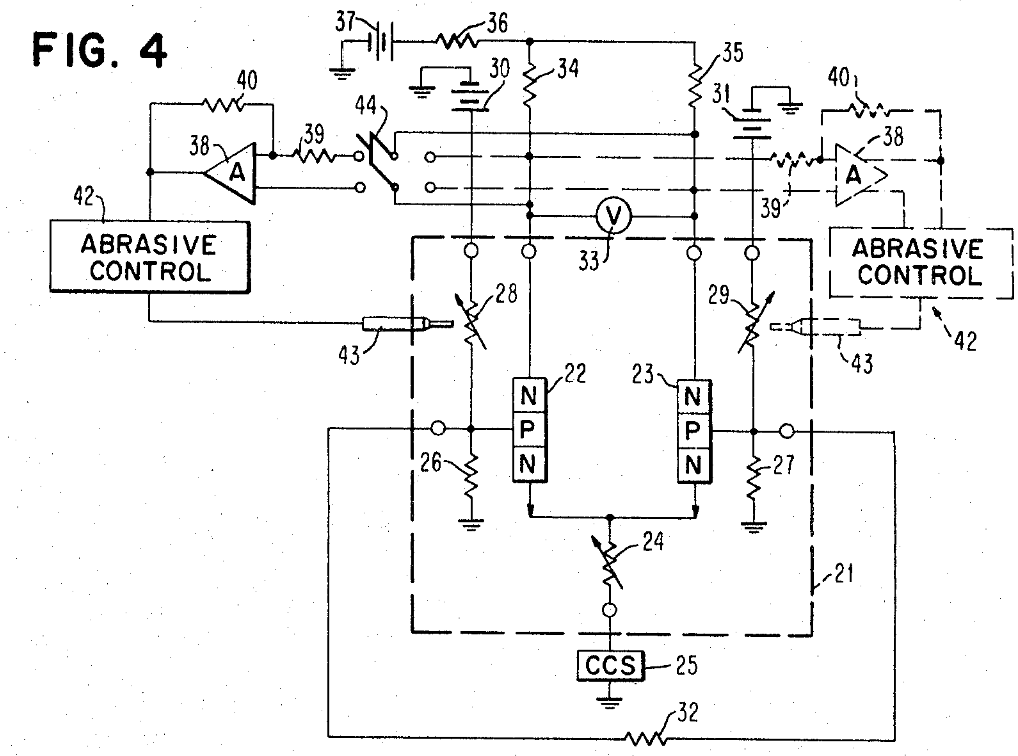
FIGURES 4 and 5 are electrical schematics of the tailoring apparatus of the present invention illustrated in connection with the tailoring of resistors of a differential amplifier.

Referring now to FIGURE 4, there is disclosed another embodiment of the tailoring apparatus of the present invention illustrated in connection with the tailoring of a microminiature functional component 21. The specific component illustrated is a DC differential amplifier which has two transistors 22, 23 with their emitters tied together through a relatively high tailorable resistance 24 for connection to the negative terminal of a constant current source 25.

Any voltage pulse induced in a sense line (not shown) connected between the bases of the transistors 22, 23 is amplified and converted to a high impedance output. The line will be terminated at its ends by resistors 26, 27 so selected, for maximum efficiency and minimum reflections, to terminate the line at each end in its characteristic impedance.

When the bases of the transistors 22, 23 are joined by a sense line, the quiescent collector currents are normally not equal because the parameters of the transistors 22, 23 are not the same owing to inherent differences in the characteristics of the two transistors. To eliminate mismatch in the collector currents, the bases of the transistors are each connected through separate tailorable resistors 28, 29 to the positive terminal of a source 30, 31, respectively. Initially, tailorable resistors 28, 29 are of substantially equal value. Either resistor 28 or resistor 29 is tailored to make the collector currents equal.

In order to detect and correct a mismatch, the collector currents are monitored on external, standard components. The signal derived is also used to generate the signal required to control operation of the tailoring device.

In FIGURE 4 a precision resistor 32 having a resistance value equal to that of the sense line is connected between the bases of the transistors. A voltmeter 33 is connected between the collectors. In addition, two precision resistors 34, 35 of equal value are series connected in shunt with voltmeter 33. The series junction point of the two resistors 34, 35 is connected through a third precision resistor 36 to the positive terminal of a DC source 37. It is assumed that the potential drop across external standard precision resistor 35 is less than the voltage drop across external standard prevision resistor 34, a condition which, if desired, can be visually detected by the null reading voltmeter 33. As precision resistors 34, 35 are closely matched in value, the collector current from transistor 22 must be greater than the current from the collector of transistor 23.

A monitoring circuit including the operational amplifier 38, source 39 and feedback 40 resistors produces an output signal which controls the abrasive control 41 of trimmer 42 that regulates flow of abrasive material from nozzle 43 to increase the value of tailorable resistor 28 until the voltage drops across the standard precision resistors 34, 35 are equal, forcing the abrasion process to halt. The collector currents are now balanced.

If instead of the voltage drop across the standard precision resistor 35 being less than that across standard precision resistor 34, the reverse is true, then in the instance the resistance of tailorable resistors 29 is increased by the abrasive action of the material from nozzle 43 until the collector currents are balanced. A switch 44 is employed in the external circuitry to change from resistor 28 abrading to resistor 29 abrading.

Figure 5:
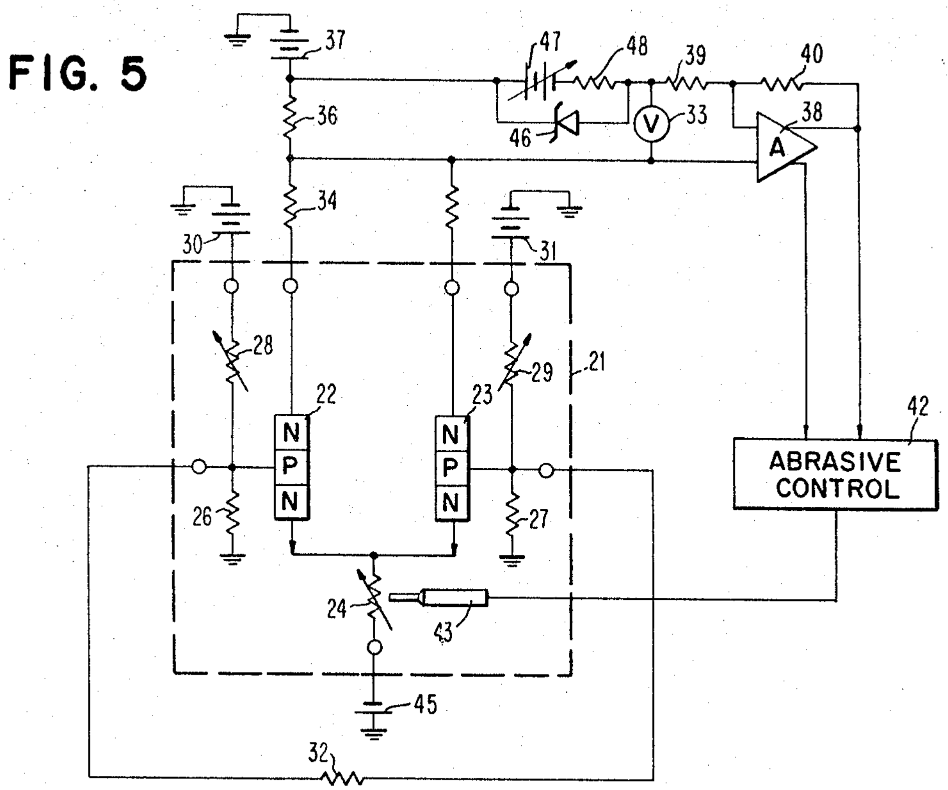

With the collector currents now balanced it is only necessary to adjust the total collector current, thereby tailoring the component 21 to it predetermined DC operating point. Referring now to FIGURE 5, the tailorable resistor 24 is connected to the negative terminal of a constant voltage source 45. The voltage drop across an external precision resistor 36 connected to resistors 34, 35 is monitored, compared to a standard reference voltage, in this case the voltage drop produced across the Zener diode 46 by the source 47 serially connected to the diode 46 and resistor 48. The value of tailorable resistor 24 can be trimmed until the drop across the standard precision resistor 36 is the same as the voltage drop across the Zener diode 46 forcing cessation of the abrasive mechanism 42. The component is now tailored to a predetermined DC operating point.

Figure 6:
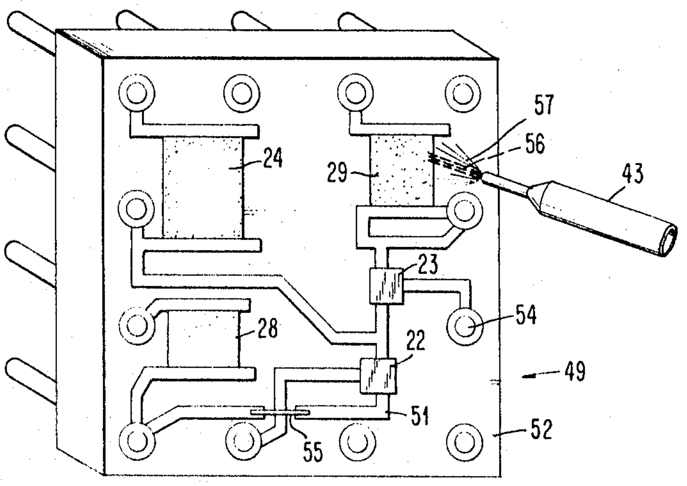
FIGURE 6 is an enlarged, fragmentary perspective view of a microminiature substrate showing a portion of the functional component schematically represented in FIGURES 4 and 5 having one of its resistors trimmed.
Figure 7:
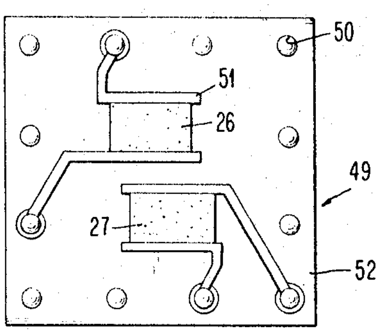
FIGURE 7 is a reduced bottom view of the substrate of FIGURE 6 showing the remaining portion of the functional component schematically represented in FIGURES 4 and 5.

Referring now to FIGURES 6 and 7, there is disclosed a microminiature module including a supporting dielectric substrate 49 having circuitry formed thereon coresponding to the functional component 21 of FIGURES 4 and 5. The substrate can be composed of any of the common dielectric materials such as 96% alumina ceramic and is the order of 0.45" x 0.45" x 0.06" thick. A plurality of pin terminal holes 50 are formed about the periphery.

Prior to printing a unique metallic circuit topology on the top 52 and bottom 53 of substrate 49, the substrate is cleaned by immersion in trichloroethylene. The immersed substrate is placed in an ultrasonic cleaner for approximately five minutes. Upon removal, substrates are dried in warm air for approximately fifteen minutes.

After cleaning, the unique metallic circuit topology 51 is printed. Metallizing inks, typically compositions of gold, silver and platinum, are employed in the printing process. The ink must have excellent adhesion properties to the substrate, as well as provide good electrical conductivity and soldering characteristics. The printing on the substrates is done by a conventional silk screening process. After formation of the unique circuit topology, the substrate is fired in a conventional oven at approximately 750–800° C. for a period of approximately thirty minutes. The final solidified conductors are approximately 5 to 10 mils in width and may be separated by an equal distance.

The resistor elements are next printed on the substrate, tailorable resistors 24, 28, 29 on top surface 52 (FIGURE 6) while resistors 26, 27 are printed on bottom surface 40 (FIGURE 7). A conventional silk screen process is also employed to print the resistors. The resistors are printed in relatively wide spaces between parallel or disposed conductor paths. The resistor composition is a metal-glass paste which is squeegeed onto the silk screen. Dispersed conductive insulating materials have good deposition and other properties. One composition found to have excellent reproducibility iin the process is a palladium oxide-silver composition which is described in a previously field application, Serial No. 267,643, filed March 25, 1963, and assigned to the same assignee as that of the present invention, now U.S. Patent No. 3,337,365 issued August 22, 1967. The resistivity range of the previously mentioned composition may be varied from 50–50,000 ohms per square. Such changes are accomplished by varying the composition as described, for example, in the previously mentioned application. Alternately, the thickness of application of the paste on the screen may be readily controlled by silk screen process.

After fixedly positioning pins 54 within the holes 50, a tinning operation may be performed to assure good electrical connection between pins 54 and pattern 51 and reduce the series resistance of the pattern. The solder so provided is used for subsequent joining of active elements. At this point all resistors are trimmed, as by abrasion, to their nominal circuit values to a ±2% tolerance, except resistor 24 which is trimmed to some resistance value well below its expected final value.

The next operation is fastening the active devices 22, 23 or chips to the substrate 49. The chip device is of the type more fully described in a paper entitled "An Approach to Low Costs, High Performance Microelectronics" by E. M. Davis et al., which was presented at the Western Electronics Conference held in San Francisco, Calif., on August 20, 1963. The devices are inverted and secured to the substrate in a planar arrangement. Details of various chip-to-substrate fastening operations are described in a copending application entitled "Bonded Joint and Method of Fabrication" by S. Merrin, et al., Serial No. 513,412, filed December 13, 1965, and assigned to the same assignee as the present invention.

At this time also a preformed conductive bridge 55 is soldered between two portions of pattern 51 and over another to permit all of the pattern to be formed within the pin cage.

Finally, the component tailoring or trimming operation described in detail above is performed. The component trimming is realized by an abrasion operation. Alternatively, trimming may also be accomplished by burning or grinding. The substrate is inserted in a fixture (not shown) that directs abrasive material 56 through nozzle 43 to the resistor being trimmed. As the substrate moves under a nozzle, a path or notch is cut into the resistor which raises the resistor value to its desired level.

All circuit elements are temperature sensitive to some degree. When the parameter of a circuit element is being adjusted to a predetermined value, any thermal disturbance created in the circuit by the apparatus used to adjust the circuit will result in an error when the circuit is returned to its normal temperature environment.

Referring specifically to FIGURE 6, in the trimming of microminiature module resistors by abrasion, high pressure air 57 directed from the nozzle 43 carries a stream of abrasive particles 56 which cuts a notch in the pattern of the resistor being trimmed to raise the resistor to its desired level. The trimming apparatus also produces a net localized cooling action due to the cooling upon expansion of the air 57 carrying the abrasive particles from the nozzle. The cooling action gives rise to a temperature gradient in the substrate 52 which is of negligible consequence in prior art resistor trimming processes where each resistor is trimmed to very close tolerances prior to active element placement. In the component trimming method of the present invention, however, where resistors are tailored after active element placement, the fact that one of the transistors (transistor 23 in FIGURE 6) is closer to resistor 29 being tailored than transistor 22, results in transistor 23 being cooler than transistor 22 during actual trimming. Momentarily, therefore, and during the time one is attempting to balance the collector currents, less current will flow through transistor 23 than under normal thermal environment. Balance of collector currents would be achieved with resistor 29 being trimmed to a lower resistance value. When the substrate warms up to ambient temperature, the collector currents will be out of balance.

Figure 8:
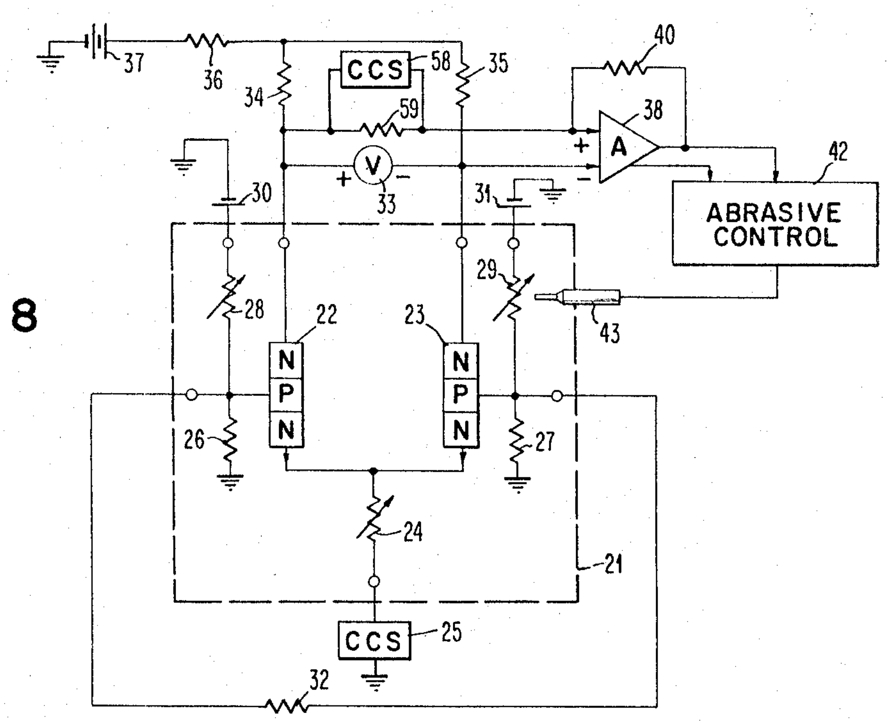
FIGURE 8 is an electrical schematic similar to FIGURE 4 but employing thermal compensation means.

This objectional feature is overcome as shown in FIGURE 8 by the use of a constant current source 58 to force current through a low value compensating resistor 59 causing a compensating voltage to buck out some of the voltage monitored. The compensating signal is made equal to but opposite to the signal created by a non-compensated adjusted circuit in its normal thermal environment. The same standard external components are used both for the measurement of the error without compensation and for measuring the DC operating point while adjusting the component. When the cooling air 57 is removed from the circuit the monitoring voltage returns to 0 as the collector current of transistor 23 increases. The circuit now operates in a balanced fashion under normal thermal environment conditions.

Summarizing briefly, the present invention has provided a novel method and apparatus for tailoring microminiature components the distinct advantage being the reproducibility of circuit operating points, by placing each component in an operating environment, monitoring its output on external precision components, and altering the characteristics of passive elements included in the component until a predetermined operating point is achieved.

Thus, while the invention has been particularly shown and described with reference to the preferred embodiments thereof, it will be understood by those skilled in the art that the foregoing and other various changes in form and details may be made therein without departing from the spirit and scope of the invention.

What is claimed is:

1. Apparatus for tailoring a microminiature functional component to a predetermined DC operating point, said component including active and passive elements defining an electrically continuous circuit, at least one of said elements being a tailorable device whose impedance is capable of being altered to vary the output current of said component comprising:

- means for energizing said component;
- a standard impedance element for monitoring the output current of said component;
- means for measuring the potential drop across said standard impedance element;
- said measuring means including a reference voltage in parallel with said standard impedance element, and providing an output signal when the potential drop across said standard impedance element is different from the value of said reference voltage;
- means for altering the impedance of said tailorable device;
- means controlled by said measuring means to discontinue operation of said impedance altering means when the potential drop across said standard impedance element reaches a predetermined value;
- said controlled means being energized by said output signal, and including an amplifier for amplifying the output signal generated by said measuring means; and,
- thermal compensating means connected between said measuring means and said controlled means, said compensating means producing a signal for bucking out a portion of said measuring means output signal to compensate for thermal disturbances to said components created by said impedance altering means.

2. Apparatus according to claim 1 wherein said thermal compensating means includes a compensating resistor connected between said measuring means and said controlled means and a constant current source connected across said compensating resistor.

References Cited

UNITED STATES PATENTS

| | | | |
|---|---|---|---|
| 2,707,356 | 5/1955 | Bayha | 51—8 |
| 2,773,332 | 12/1956 | Buchman et al. | 51—319 X |
| 2,884,746 | 5/1959 | Rus et al. | 51—165 X |
| 3,025,466 | 3/1962 | Beers | 324—62 |
| 3,185,932 | 5/1965 | Walker et al. | 330—12 |

FOREIGN PATENTS

| | | |
|---|---|---|
| 550,502 | 1/1943 | Great Britain. |

OTHER REFERENCES

"Printed Circuit," Television Engineering, November 1950, p. 24.

"Mechanization of Printed Amplifier Assembly," Dept. of the Army, Contract DA-30-115-502-ORD-848, Final Report dated May 8, 1958, pp. 16, 18, 22 and 42-44.

JAMES L. JONES, Jr., *Primary Examiner.*

U.S. Cl. X.R.

51—14, 165, 319